(12) United States Patent
Pierrat

(10) Patent No.: US 7,122,281 B2
(45) Date of Patent: Oct. 17, 2006

(54) CRITICAL DIMENSION CONTROL USING FULL PHASE AND TRIM MASKS

(75) Inventor: Christophe Pierrat, Santa Clara, CA (US)

(73) Assignee: Synopsys, Inc., Mountain View, CA (US)

( * ) Notice: Subject to any disclaimer, the term of this patent is extended or adjusted under 35 U.S.C. 154(b) by 569 days.

(21) Appl. No.: 10/295,160

(22) Filed: Nov. 14, 2002

(65) Prior Publication Data

US 2003/0162102 A1    Aug. 28, 2003

Related U.S. Application Data

(60) Provisional application No. 60/359,909, filed on Feb. 26, 2002.

(51) Int. Cl.
G03F 9/00 (2006.01)
G06F 17/50 (2006.01)

(52) U.S. Cl. ............... 430/5; 430/30; 716/19

(58) Field of Classification Search ............ 430/5, 430/30; 716/19
See application file for complete search history.

(56) References Cited

U.S. PATENT DOCUMENTS

| 5,302,477 A | 4/1994 | Dao et al. ............ 430/5 |
| 5,308,741 A | 5/1994 | Kemp ............ 430/312 |
| 5,324,600 A | 6/1994 | Jinbo et al. ............ 430/5 |
| 5,364,716 A | 11/1994 | Nakagawa et al. ............ 430/5 |
| 5,472,814 A | 12/1995 | Lin ............ 430/5 |
| 5,523,186 A | 6/1996 | Lin et al. ............ 430/5 |
| 5,527,645 A | 6/1996 | Pati et al. ............ 430/5 |
| 5,537,648 A | 7/1996 | Liebmann et al. ............ 395/500 |
| 5,538,815 A | 7/1996 | Oi et al. ............ 430/5 |
| 5,565,286 A | 10/1996 | Lin ............ 430/5 |
| 5,573,890 A | 11/1996 | Spence ............ 430/311 |
| 5,595,843 A | 1/1997 | Dao ............ 430/5 |
| 5,620,816 A | 4/1997 | Dao ............ 430/5 |
| 5,635,316 A | 6/1997 | Dao ............ 430/5 |
| 5,636,131 A | 6/1997 | Liebmann et al. ............ 364/490 |
| 5,702,848 A | 12/1997 | Spence ............ 430/5 |
| 5,761,075 A | 6/1998 | Oi et al. ............ 364/488 |
| 5,766,804 A | 6/1998 | Spence ............ 430/5 |

(Continued)

FOREIGN PATENT DOCUMENTS

DE    195 45 163 A1    6/1996

(Continued)

OTHER PUBLICATIONS

Ackmann, P., et al., "Phase Shifting and Optical Proximity Corrections to Improve CD Control on Logic Devices in Manufacturing for Sub 0.35 μm I-Line", SPIE, vol. 3051, pp. 146-153, Mar. 12-14, 1997.

(Continued)

*Primary Examiner*—Saleha R. Mohamedulla
(74) *Attorney, Agent, or Firm*—Bever, Hoffman & Harms, LLP; Jeanette S. Harms

(57) ABSTRACT

To print sub-wavelength features on a wafer, a mask set including a full phase PSM (FPSM) and a corresponding trim mask can be used. Phase assignments on the FPSM can result in some feature definition with the trim mask, particularly in non-critical areas. Unfortunately, this limited feature definition can cause significant critical dimension (CD) variations in these non-critical areas. Undesirable critical dimension (CD) variations can be better controlled, even with substantial mask misalignment, by defining multiple feature edge portions with the trim mask in non-critical areas, such as T-intersections, elbows, and other types of intersecting lines.

17 Claims, 14 Drawing Sheets
(7 of 14 Drawing Sheet(s) Filed in Color)

U.S. PATENT DOCUMENTS

| | | | |
|---|---|---|---|
| 5,766,806 A | 6/1998 | Spence | 430/5 |
| 5,807,649 A | 9/1998 | Liebmann et al. | 430/5 |
| 5,858,580 A | 1/1999 | Wang et al. | 430/5 |
| 5,923,562 A | 7/1999 | Liebmann et al. | 364/488 |
| 5,923,566 A | 7/1999 | Galan et al. | 364/489 |
| 5,994,002 A | 11/1999 | Matsuoka | 430/5 |
| 5,998,068 A | 12/1999 | Matsuoka | 430/5 |
| 6,057,063 A | 5/2000 | Liebmann et al. | 430/5 |
| 6,066,180 A | 5/2000 | Kim et al. | 716/19 |
| 6,083,275 A | 7/2000 | Heng et al. | 716/19 |
| 6,130,012 A | 10/2000 | May et al. | 430/5 |
| 6,139,994 A | 10/2000 | Broeke et al. | 430/5 |
| 6,185,727 B1 | 2/2001 | Liebmann | 716/19 |
| 6,228,539 B1 | 5/2001 | Wang et al. | 430/5 |
| 6,251,549 B1 | 6/2001 | Levenson | 430/11 |
| 6,258,493 B1 | 7/2001 | Wang et al. | 430/5 |
| 6,335,128 B1 | 1/2002 | Cobb et al. | 430/5 |
| 6,338,922 B1 | 1/2002 | Liebmann et al. | 430/5 |
| 6,420,074 B1 | 7/2002 | Wang et al. | 430/5 |
| 6,436,590 B1 | 8/2002 | Wang et al. | 430/5 |
| 2001/0000240 A1 | 4/2001 | Wang et al. | 430/5 |
| 2001/0028985 A1 | 10/2001 | Wang et al. | 430/5 |
| 2002/0083410 A1 | 6/2002 | Wu et al. | 716/19 |
| 2002/0122994 A1 | 9/2002 | Cote et al. | 430/5 |
| 2002/0127479 A1 | 9/2002 | Pierrat | 430/5 |
| 2002/0129327 A1 | 9/2002 | Pierrat et al. | 716/19 |
| 2002/0136964 A1 | 9/2002 | Pierrat | 430/5 |
| 2002/0142231 A1 | 10/2002 | Kling et al. | 430/5 |
| 2002/0142232 A1 | 10/2002 | Kling et al. | 430/5 |
| 2002/0144232 A1 | 10/2002 | Ma et al. | 716/21 |
| 2002/0152454 A1 | 10/2002 | Cote et al. | 716/21 |
| 2002/0155363 A1 | 10/2002 | Cote et al. | 430/5 |

FOREIGN PATENT DOCUMENTS

| | | |
|---|---|---|
| EP | 0 653 679 A2 | 5/1995 |
| GB | 2333613 | 7/1999 |
| JP | 62067547 | 3/1987 |
| JP | 2-140743 | 5/1990 |
| JP | 1.283.925 | 2/1991 |
| JP | 6-67403 | 3/1994 |
| JP | 8051068 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 98/12605 A1 | 3/1998 |
| WO | WO 01/23961 A1 | 4/2001 |
| WO | WO 02/03140 A1 | 1/2002 |
| WO | WO 02/073312 A1 | 9/2002 |

OTHER PUBLICATIONS

Levenson, M., et al., "Improving Resolution in Photolithography with a Phase-Shifting Mask", IEEE. Transactions On Electron Devices, vol. ED-29, No. 12, pp. 1828-1836, Dec. 1982.

Levenson, M., et al., "The Phase-Shifting Mask II: Imaging Simulations and Submicrometer Resist Exposures", IEEE Transactions on Electron Devices, vol. ED-31. No. 6, pp. 753-763, Jun. 1984.

Terasawa, T., et al., "0.3-Micron Optical Lithography Using a Phase-Shifting Mask", SPIE, Optical/Laser Microlithography II. vol. 1088, pp. 25-33, Mar. 1989.

Nitayama, A., et al., "New Phase Shifting Mask with Self-Aligned Phase Sifters for a Quarter Micron Photolithography", IEDM. pp. 3.3.1-3.3.4, Dec. 3-6, 1989.

Jinbo, H., et al., "0.2 µm or Less i-Line Lithography by Phase-Shifting-Mask Technology", IEEE, pp. 33.3.1-33.3.4 (1990).

Neureuther, A., "Modeling Phase Shifting Masks", SPIE, 10th Annual Symposium On Microlithography, vol. 1496, pp. 80-85 (1990).

Yamanaka, T., et al., "A 5.9 µm2 Super Low Power SRAM Cell Using a New Phase-Shift Lithography", IEDM, pp. 18.3.1-18.3.4 (1990).

Inokuchi, K., et al., "Sub-Quarter Micron Gate Fabrication Process Using Phase-Shifting-Mask for Microwave GaAs Devices", Extended Abstracts Of The 1991 Intl. Conference On Solid State Devices And Materials, Yokohama, Japan, pp. 92-94 (1991).

Inokuchi, K., et al., "Sub-Quarter-Micron Gate Fabrication Process Using Phase-Shifting Mask for Microwave GaAs Devices", Japanese Journal Of Applied Physics, vol. 30, No. 12B, pp. 3818-3821, Dec. 1991.

Jinbo, II., et al., "Improvement of Phase-Shifter Edge Line Mask Method", Japanese Journal Of Applied Physics, vol. 30, No. 11B, pp. 2998-3003, Nov. 1991.

Kimura, T., et al., "Subhalf-Micron Gate GaAs Mesfet Process Using Phase-Shifting-Mask Technology", IEEE, GaAs IC Symposium, pp. 281-284 (1991).

Wiley, J., et al., "Phase Shift Mask Pattern Accuracy Requirements and Inspection Technology", SPIE, Integrated Circuit Metrology, Inspection, And Process Control V, vol. 1464, pp. 346-355 (1991).

Hirai, Y., et al., "Automatic Pattern Generation System for Phase Shfiting Mask", 1991 Symposium on VLSI Technology, Digest of Technical Papers, pp. 95-96, May 28-30, 1991.

Wong, A., et al., "Investigating Phase-Shifting Mask Layout Issues Using a Cad Toolkit", IEEE, pp. 27.4.1-27.4.4 (1991).

Terasawa, T., et al., "Imaging Characteristics of Multi-Phase-Shifting and Halftone Phase-Shifting Masks", Japanese Journal of Applied Physics, vol. 30, No. 11B, pp. 2991-2997, Nov. 1991.

Burggraaf, P., "Four More Significant Japanese Advances in Phase Shfiting Technology", Semiconductor International, p. 16, Dec. 1991.

Kemp, K., et al., "Optimized Phase Shift Mask Designs for Real Devices", KTI Microlithography Seminar, pp. 67-75, Oct. 14-15, 1991.

Newmark, D., et al., "Phase-Shifting Mask Design Tool", SPIE—11th Annual BACUS Symposium on Photmask Technology, vol. 1604, pp. 226-235, Sep. 25-27, 1991.

Nolscher, C., et al., "Investigation of Self-Aligned Phase-Shifting Reticles by Simulation Techniques", SPIE—Optical/Laser Microlithography IV, vol. 1463, pp. 135-150 (1991).

Inoue, S., et al., "Simulation Study on Phase-Shifting Masks for Isolated Patterns", Japanese Journal of Applied Physics, vol. 30, No. 11B, pp. 3010-3015, Nov. 1991.

Watanabe, H., et al., "Detection and Printability of Shifter Defects in Phase-Shifting Masks", Japanese Journal of Applied Physics, vol. 30, No. 11B, pp. 3016-3020, Nov. 1991.

Watanabe, H., et al., "Pattern Transfer Characteristics of Transparent Phase Shifting Mask", Japanese Journal of Applied Physics, vol. 30, No. 11B, pp. 3004-3009, Nov. 1991.

Jinbo, H., et al., "Application of Blind Method to Phase-Shifting Lithography", IEEE, 1992 Symposium On VLSI Technology Digest Of Technical Papers, pp. 112-113 (1992).

Watanabe, II., et al., "Detection and Printability of Shifter Defects in Phase-Shifting Masks II Defocus Characteristics", Jpn. J. Appl. Phys., vol. 31, pp. 4155-4160 (1992).

Pierrat, C., et al., "Phase-Shifting Mask Topography Effects on Lithographic Image Quality", IEEE, pp. 3.3.1-3.3.4 (1992).

Burggraaf, P., "Lithography's Leading Edge, Part 1: Phase-Shift Technology and Part 2: I-Line and Beyond", Semiconductor International, pp. 43-47 and 52-56, Feb. 1992.

IBM, "Phase-Shift Mask Utilizing Silicon Oxy-Nitride as a Low Reflectivity Phase-Shift Layer", IBM Technical Disclosure Bulletin, vol. 34, No. 10B, pp. 360-361, Mar. 1992.

Brunner, T., et al., "170nm Gates Fabricated by Phase-Shift mask and Top Anti-Reflector Process", SPIE, Optical/Laser Microlithography VI, Vo. 1927, pp. 182-189 (1993).

Lin, B.J., "Phase-Shifting Masks Gain an Edge", IEEE Circuits & Devices, pp. 28-35, Mar. 1993.

Moniwa, A., et al., "Algorithm for Phase-Shift Mask Design with Priority on Shifter Placement", Jpn. J. Appl. Phys., vol. 32, Pt. 1, No. 12B, pp. 5874-5879, Dec. 1993.

Ooi, K., et al., "Computer Aided Design Software for Designing Phase-Shifting Masks", Jpn. J. Appl. Phys., vol. 32, Pt. 1, No. 12B, pp. 5887-5891, Dec. 1993.

Ohtsuka, H., et al., "Evaluation of Repair Phase and Size Tolerance for a Phase-Shift Mask", J. Vac. Sci. Technol. B, vol. 11, No. 6, pp. 2665-2668, Nov./Dec. 1993.

Ronse, K., et al., "Comparison of Various Phase Shift Strategies and Application to 0.35 μm ASIC Designs", SPIE—Optical/Laser Microlithography VI, vol. 1927, pp. 2-16 (1993).

Galan, G., et al., "Application of Alternating-Type Phase Shift Mask to Polysilicon Level for Random Logic Circuits", Jpn. J. Appl. Phys. vol. 33, pp. 6779-6784 (1994).

Mizuno, F., et al., "Practical Phase-Shifting Mask Technology for 0.3 μm Large Scale Integrations", J. Vac. Sci. Technol. B. Vol. 12, No. 6, pp. 3799-3803, Nov./Dec. 1994.

Pati, Y.C., et al., "Phase-Shifting Masks for Microlithography: Automated Design and Mask Requirements", J. Opt. Soc. Am., vol. 11, No. 9, pp. 2438-2452, Sep. 1994.

Stirniman, J., et al., "Wafer Proximity Correction and Its Impact on Mask-Making", Bacus News, vol. 10, Issue 1, pp. 1, 3-7,10-12, Jan. 1994.

Waas, T., et al., "Automatic Generation of Phase Shift Mask Layouts", Microelectronic Engineering, vol. 23, pp. 139-142 (1994).

Barouch, E., et al., "OPTIMASK: An OPC Algorithm for Chrome and Phase-Shift Mask Design", SPIE, Vo. 2440, pp. 192-206, Feb. 1995.

Moniwa, A., et al., "Heuristic Method for Phase-Conflict Minimization in Automatic Phase-Shift Mask Design", Jpn. J. Appl. Phys., vol. 34, Pt. 1, No. 12B, pp. 6584-6589, Dec. 1995.

Langston, J., et al., "Extending Optical Lithography to 0.25 μm and Below", Solid State Technology, pp. 57-64, Mar. 1995.

Nagahiro, Y., "Improved Mask Technique for Photolithography Applied to 0.25 μm LSI—Improvement of Resolution, Pattern Correction, Exposure Area", Nikkei Microdevices, pp. 1-6, Apr. 1995.

Okamoto, Y., et al., "A New Phase Shifting Mask Technology for Quarter Micron Photolithography", SPIE, vol. 2512, pp. 311-318 (1995).

Pierrat, C., et al., "Required Optical Characterisitics of Materials for Phase-Shifting Masks", Applied Optics, vol. 34, No. 22, pp. 4923-4928, Aug. 1, 1995.

Galan, G., et al., "Alternating Phase Shift Generation for Coplex Circuit Designs", SPIE, vol. 2884, pp. 508-519, Sep. 18-20, 1996.

Kanai, H., et al., "Sub-Quarter Micron Lithography with the Dual-Trench Type Alternating PSM", SPIE, vol. 2793, pp. 165-173 (1996).

Ishiwata, N., et al., "Novel Alternating Phase Shift Mask with Improved Phase Accuracy", SPIE, Proceedings Of The 17th Annual Symposium On Photomask Technology And Management, vol. 3236, pp. 243-249 (1997).

Morimoto, H., et al., "Next Generation Mask Strategy—Technologies are Ready for Mass Production of 256MDRAM?", SPIE, vol. 3236, pp. 188-189 (1997).

Roman, B., et al., "Implications of Device Processing on Photomask CD Requirements", SPIE, vol. 3236 (1997) (Abstract Only).

Nakae, A., et al., "A Proposal for Pattern Layout Rule in Application of Alternating Phase Shift Mask", SPIE, vol. 3096, pp. 362-374 (1997).

Tsujimoto, E., et al., "Hierarchical Mask Data Design System (PROPHET) for Aerial Image Simulation, Automatic Phase-Shifter Placement and Subpeak Overlap Checking", SPIE, vol. 3096, pp. 163-172 (1997).

Yamamoto, K., et al., "IIierarchical Processing of Levenson-Type Phase Shifter Generation", Jpn. J. Appl. Phys., vol. 36, Part 1, No. 12B, pp. 7499-7503, Dec. 1997.

Gordon, R., et al., "Design and Analysis of Manufacturable Alternating Phase-Shifting Masks", Bacus News, vol. 14, Issue 12, pp. 1-9, Dec. 1998.

Ohnuma, H., et al., "Lithography Computer Aided Design Technology for Embedded Memory in Logic", JPn. J. Appl. Phys., vol. 37, Part 1, No. 12B, pp. 6686-6688, Dec. 1998.

Fukuda, H., "Node-Connection/Quantum Phase-Shifting Mask: Path to Below 0.3 μm Pitch, Proximity Effect Free, Random Interconnects and Memory Patterning", J. Vac. Sci. Technol. B, vol. 17, No. 6, pp. 3291-3295, Nov./Dec. 1999.

Spence, C., et al., "Integration of Optical Proximity Correction Strategies in Strong Phase Shifters Design for Poly-Gate Layers", Bacus News, vol. 15, Issue 12, pp. 1, Dec. 4-13, 1999.

Kuo, C., et al., "Extension of Deep-Ultraviolet Lithography for Patterning Logic Gates Using Alternating Phase Shifting Masks", J. Vac. Sci. Technol. B, vol. 17, No. 6, pp. 3296-3300, Nov./Dec. 1999.

Palmer, S., et al., "Dual Mask Model-Based Proximity Correction for High Performance 0.10 μm CMOS Process", The 44th Int'l Conference on Electron, Ion & Photon Beam Tech. and Nanofabrication Abstracts, pp. 18-19, May 30-Jun. 2, 2000.

Kikuchi, K., et al., "Method of Expanding Process Window for the Double Exposure Technique with alt-PSMs", Optical Microlithography XIII, Proceeding of SPIE, vol. 4000, pp. 121-131 (2000).

Cooke, M., "OPC/PSM Designs For Poly Gate Layers", European Semiconductor, vol. 22, No. 7, pp. 57-59, Jul. 2000.

Granik, Y., et al., "Sub-Resolution Process Windows And Yield Estimation Technique Based On Detailed Full-Chip CD Simulation", SPIE, vol. 4182, pp. 335-341 (2000).

Plat, M., et al., "The Impact of Optical Enhancement Techniques on the Mask Error Enhancement Funchtion (MEEF)", SPIE, vol. 4000, pp. 206-214, Mar. 1-3, 2000.

Mansuripur, M., et al., "Projection Photolithography", Optics & Photonics News 11, 17 pages, Feb. 2000.

Heng, F., et al., "Application of Automated Design Migration to Alternating Phase Sifht Mask Design", IBM Research Report RC 21978 (98769), Feb. 26, 2001 (7 pages).

Wong, A., et al., "Alternating Phase-Shifting Mask with Reduced Aberration Sensitivity: Lithography Considerations", Proc. SPIE, vol. 4346, pp. 1-9 (2001).

Liebmann, L.W., et al., "TCAD Development For Lithography Resolution Enhancement", IBM J. Res. & Dev., vol. 45, No. 5, pp. 651-665, Sep. 5, 2001.

CRITICAL DIMENSION CONTROL USING FULL PHASE AND TRIM MASKS

RELATED APPLICATIONS

This application is related to and claims the benefit of priority of the provisional application 60/359,909 filed 26 Feb. 2002, entitled "Non-Critical Blocking For Full Phase Masks", having inventor Christophe Pierrat, and assigned to the assignee of the present application.

BACKGROUND OF THE INVENTION

1. Field of the Invention

The present invention relates to layouts used to fabricate a phase shifting mask (PSM) and a trim mask, and in particular to various modifications that can be made to the PSM layout and the trim mask layout to provide critical dimension (CD) control, even in non-critical areas.

2. Description of the Related Art

An advance in lithography called phase shifting is able to generate features on the wafer that are smaller than the corresponding wavelength of the light. These ultra-small features are generated by the interference of light in adjacent, complementary pairs of phase shifters having opposite phase, e.g. 0 and 180 degrees. In one embodiment, the phase shifters can be formed on a phase shifting mask (PSM), which is used in conjunction with a trim mask to define features of a layout. In the PSM, complementary phase shifters (hereinafter referred to as shifters) are configured such that the exposure radiation transmitted by one shifter is 180 degrees out of phase with the exposure radiation transmitted by the other shifter. Therefore, rather than constructively interfering and merging into a single image, the projected images destructively interfere where their edges overlap, thereby creating a clear and very small image between the phase shifters.

The PSM has been used to define certain critical edges of a feature, whereas a light field trim mask has been used to define the other edges of the feature. For example, the PSM can be used to define the gates of an integrated circuit, whereas the trim mask can be used to define the other edges in the integrated circuit. More recently, the PSM has been used to define substantially all features on the layout including both critical and non-critical features. For example, in one type of PSM called a full phase PSM (FPSM), a trim mask can protect areas defined by the FPSM as well as expose undesirable features that may print because of phase assignments on the FPSM.

For example, FIG. 1A illustrates an exemplary layout 100 for a FPSM, wherein this layout defines a T-intersection. Layout 100, which is implemented in a dark field mask, includes two 0 degree shifters 101 and 104 as well as two 180 degree shifters 102 and 103. Shifters 101 and 103 define one line of the T-intersection, shifters 102 and 104 define another line of the T-intersection, and shifters 101 and 102 define yet another line of the T-intersection.

Note that the phase assignments discussed herein are illustrative only. The important aspect is that shifters on opposite edges of a line have a phase difference of approximately 180 degrees. Thus, shifters 101 and 104 could be 180 degree shifters, whereas shifters 102 and 103 could be 0 degree shifters. Moreover, shifters 101 and 104 could be 185 degree shifters, and shifters 102 and 103 could be 5 degree shifters. To conform to this configuration in a T-intersection, one corner can include one shifter (e.g. shifter 101) and another corner can include two shifters (e.g. shifters 103 and 104).

A cut 105 between shifters 103 and 104 solves a potential phase conflict when assigning phase to the T-intersection (i.e. a "cut" separates two shifters that in the absence of a phase conflict could be implemented as a single shifter), but results in an extraneous feature when exposed. A trim mask layout 110, shown in FIG. 1B, can erase this extraneous feature (i.e. by exposing the photoresist in that area). Specifically, trim mask layout 110 includes a cut 111 to account for the proximity of shifters 103 and 104 in the right corner of FPSM layout 100. Of importance, cut 111 on trim mask layout 110 actually defines the right corner of the feature (i.e. the T-intersection). The other areas of trim mask layout 110 protect the features defined by FPSM layout 100.

FIG. 1C illustrates an aerial image 120 (determined by simulation) assuming a double exposure using masks implementing FPSM layout 100 and trim layout 110. In image 120, the following parameters were used: a wavelength of 193 nm, a numerical aperture (NA) of 0.7, and a partial coherence factor ($\sigma$) of 0.5. In this case, the trim mask is exposed to twice the energy of the FPSM (i.e. a 1:2 exposure ratio). In other words, if the FPSM is exposed to N mJ/cm$^2$, then the trim mask is exposed to 2N mJ/cm$^2$.

The blue portion of image 120 indicates a low intensity, the red portion indicates a high intensity, the yellow portion indicates an intermediate intensity, etc. The high intensity correlates to a high exposure, whereas the low intensity correlates to a low exposure. As evidenced by the thin band of yellow in image 120, the transition from high to low intensity is abrupt, thereby resulting in well-defined features. However, the described corner cut in the trim mask can cause the right and left corners of the T-intersection to print differently (i.e. cause CD variations).

FIG. 2A illustrates a graph 200 that plots the CD error versus the distance to a polysilicon line for various misalignments of the FPSM mask and the trim mask. (For reference, FIG. 2B illustrates the desired T-intersection that is to be produced using the masks created from the layouts of FIGS. 1A and 1B, wherein a CD is measured at a cut line 201 taken at a distance 202 from a polysilicon line 203.) The indicated measurements in FIG. 2A, i.e. the CD errors, distances, and misalignments are in nanometers. The misalignments shown in the legend (to the immediate right of FIG. 2A), d(0,0), d(10,10), etc., refer to (x,y) misalignments of the PSM and trim mask relative to each other. Graph 200 shows that as the distance increases (i.e. moving away from the corner of the T-intersection), the CD error decreases irrespective of mask misalignments. However, the mask misalignments can cause significant CD errors, particularly near the corners.

FIG. 2C illustrates a graph 210 that plots the CD versus the distance to the poly line (both measurements in nanometers). In this example, the CD decreases (e.g. the layout is changed and the corresponding PSM and trim mask are revised as well) from approximately 135 nm to approximately 115 nm as the distance to the polysilicon line increases from 75 nm to 200 nm. In other words, the CD at a corner is significantly greater than the nominal CD, e.g. in this case, 100 nm, but approaches the nominal CD as the effects of the corner rounding decrease.

Therefore, a need arises for a technique in a full-phase PSM that provides CD control at line intersections while at the same time minimizes sensitivity to mask misalignment.

SUMMARY OF THE INVENTION

To print sub-wavelength features on a wafer, a mask set including a full phase PSM (FPSM) and a corresponding trim mask can be used. Phase assignments on the FPSM can result in some feature definition with the trim mask, particularly in non-critical areas. Non-critical areas could include intersecting lines, such as T-intersections and elbows. Unfortunately, this limited feature definition can cause significant critical dimension (CD) variations in these non-critical areas.

In accordance with one feature of the invention, CD variations can be better controlled, even with substantial mask misalignment, by defining multiple feature edge portions with the trim mask in such non-critical areas. Specifically, a first cut can be provided on the trim mask layout, wherein the first cut defines a first corner of the intersecting lines. A second cut can also be provided on the trim mask layout, wherein the second cut defines a second corner of the intersecting lines. Cuts in the FPSM corresponding to the first and second cuts in the trim mask layout can be provided.

In one embodiment, if the intersecting lines form an elbow, then a shifter cut corresponding to an outside corner of the elbow and a shifter cut corresponding to an inside corner of the elbow can have aligned edges. In another embodiment, if the intersecting lines form a T-intersection, then a third cut can be made on the trim mask layout, wherein the third cut defines a portion of a line edge opposite the first and second corners. In either embodiment, the non-critical feature (e.g. the T-intersection or elbow) can be substantially, or even solely, defined by the trim mask layout. In this manner, even if some misalignment of the masks implementing the trim mask layout and the FPSM layout occurs, then the CDs of the intersecting lines can advantageously remain within tolerance.

Thus, in accordance with one aspect of the invention, line intersections on a layout for a layer of material on a wafer can be made less sensitive to misalignment by defining critical edge portions in the wafer layer with a FPSM. The FPSM can include a first set of cuts between adjacent phase shifters to resolve phase conflicts in defining the layout using the FPSM. The FPSM can further include a second set of cuts proximate the first set of cuts. The second set of cuts permit definition of edge portions proximate the first set of cuts using a corresponding trim mask.

In one embodiment, the trim mask is a dark field trim mask. In this case, defining non-critical edges in the wafer layer can include providing a first cut on the trim mask layout, wherein the first cut defines a first corner of at least two intersecting lines in the layer. A second cut can also be provided on the trim mask layout, wherein the second cut defines either a second corner of the intersecting lines or a portion of a line edge opposite from the first and second corners. In one embodiment, the first and second cuts are made only if a phase conflict would otherwise occur in an area in the FPSM layout corresponding to the first and second cuts.

In accordance with another aspect of the invention, a lithographic mask set used to transfer a pattern onto a wafer can be provided. The pattern can include both critical and non-critical features. This lithographic mask set can include a FPSM and a trim mask. The FPSM can include a first set of cuts between adjacent phase shifters to resolve phase conflicts in defining the features using the FPSM as well as a second set of cuts proximate the first set of cuts. The second set of cuts permit definition of edge portions proximate the first set of cuts with the trim mask. The FPSM defines a majority of the critical features of the pattern, whereas the trim mask defines a majority of the non-critical features of the pattern. Non-critical features can include, for example, T-intersections and/or elbows.

BRIEF DESCRIPTION OF THE FIGURES

The patent or application file contains at least one drawing executed in color. Copies of this patent or patent application publication with color drawing(s) will be provided by the Patent and Trademark Office upon request and payment of the necessary fee.

DETAILED DESCRIPTION OF THE FIGURES

To print sub-wavelength features on a wafer, a mask set including a full phase PSM (FPSM) and a corresponding trim mask can be used. In accordance with one feature of the invention, undesirable critical dimension (CD) variations can be better controlled, even with substantial mask misalignment, by defining multiple feature edge portions with the trim mask in non-critical areas, such as T-intersections, elbows, and other types of intersecting lines.

Figure 1A:
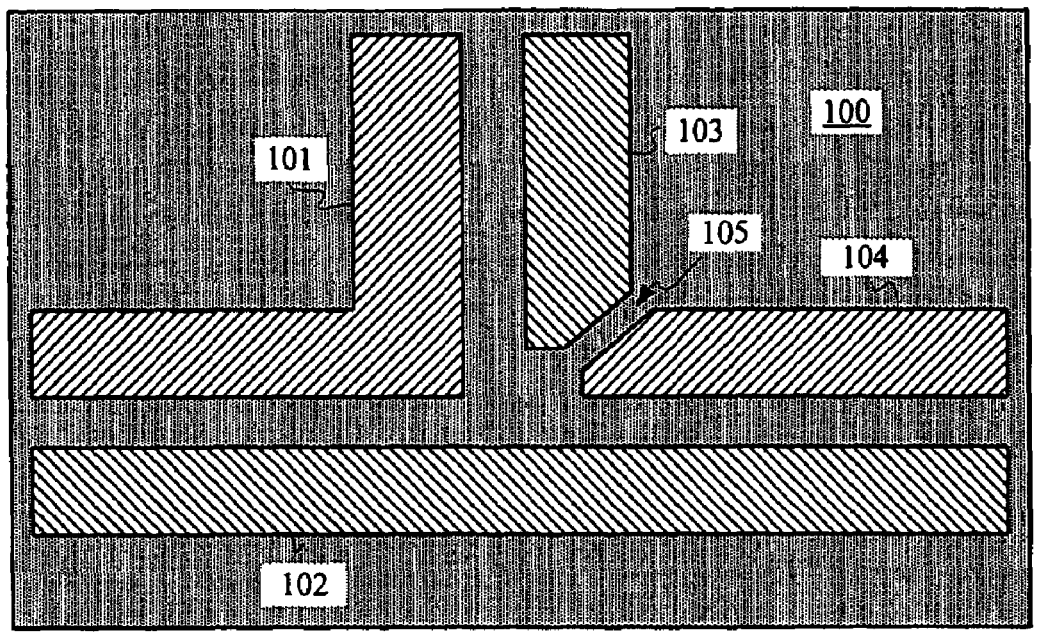
FIG. 1A illustrates a simplified layout for a full phase PSM that defines a T-intersection feature.
Figure 1B:
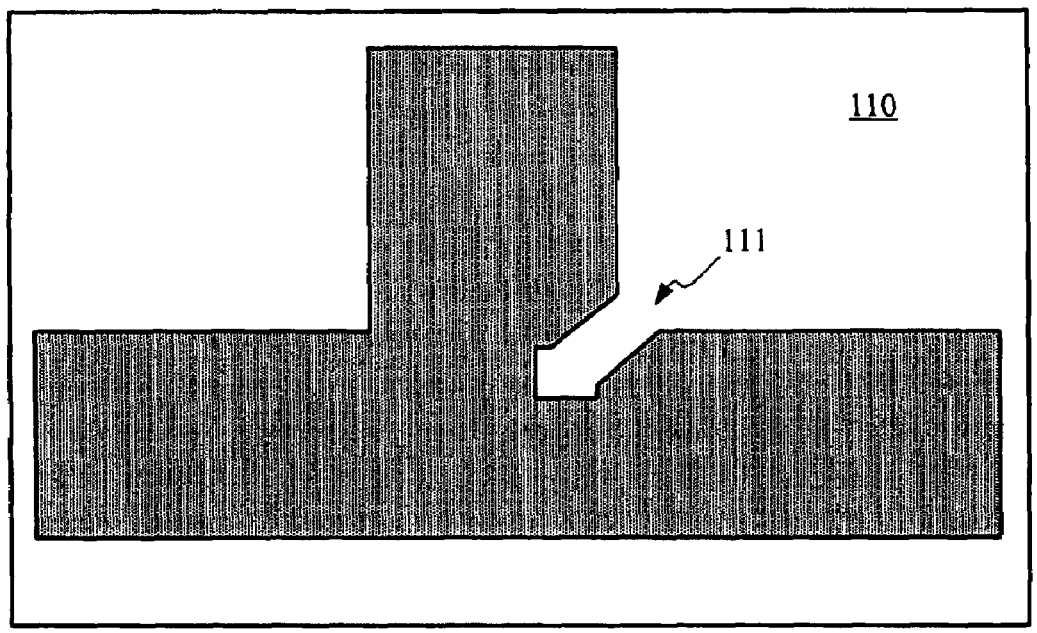
FIG. 1B illustrates a trim mask layout including a cut that can erase an extraneous feature printed using a mask implementing the FPSM layout of FIG. 1A.
Figure 3A:
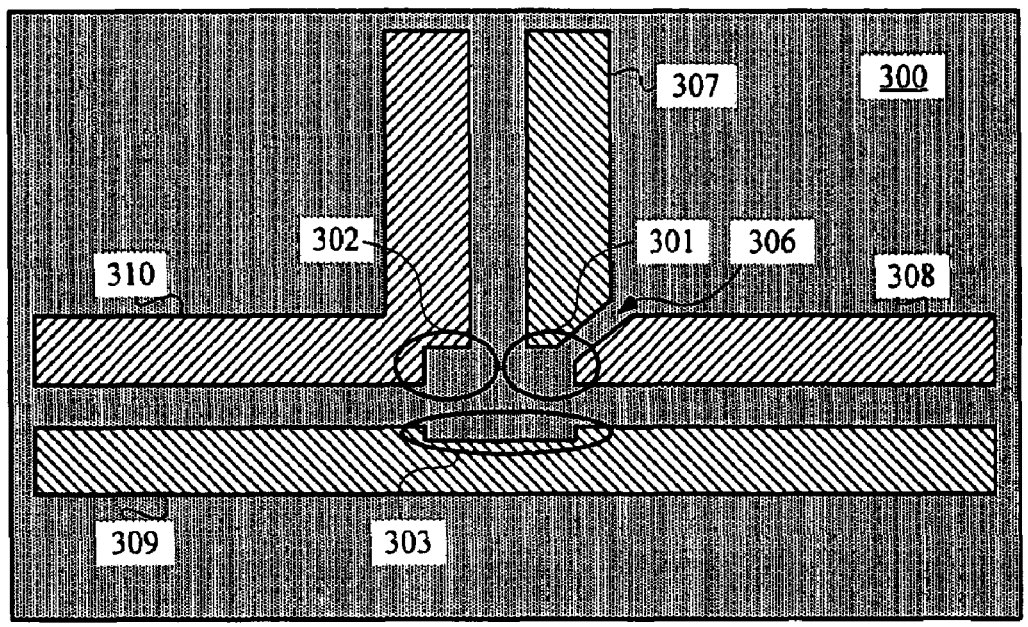
FIGS. 3A and 3B illustrate modifications that can be made to a FPSM layout and a trim mask layout, respectively, at intersecting lines to provide a more consistent CD irrespective of mask misalignment.
Figure 3B:
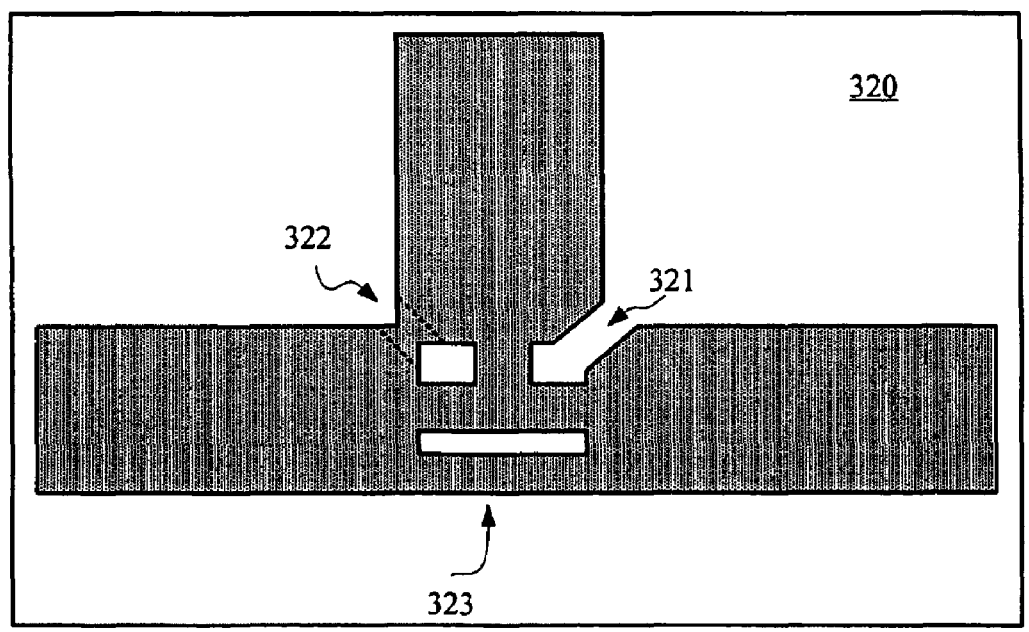

FIGS. 3A and 3B illustrate modifications that can be made to a full phase PSM (FPSM) layout and a trim layout, respectively, at intersecting lines to provide a more consistent CD irrespective of mask misalignment. For example, FIG. 3A illustrates a FPSM layout 300 including a T-intersection. FPSM layout 300, like FIG. 1A, includes a first cut 306 to resolve a potential phase conflict at the T-intersection, thereby creating shifters 307 and 308 (which are of opposite phase). Shifters 307 and 308, when implemented on a mask, print an extraneous feature in the area corresponding to cut 306.

FIG. 3B illustrates a trim mask layout 320 that can be used in combination with FPSM layout 300 (FIG. 3A) to print the T-intersection. In trim mask layout 320, cut 321 can expose the extraneous feature printed because of cut 306 between shifters 307 and 308 (FIG. 3A). Of importance, cut 321 includes a square end that effectively defines the right corner of the T-intersection.

In accordance with one feature of the invention, trim mask layout 320 further includes another cut 322 to substantially match cut 321. In the embodiment shown in FIG. 3B, a rectangle can be used. In another embodiment, a cut identical in shape to cut 321 (e.g. represented by the rectangle and the dashed lines), could be made. Cut 322, when implemented in a trim mask, allows exposure of the resist associated with the left corner of the feature on the binary mask. The phase shifter in the corresponding area is then removed (see cut 302 in FIG. 3A). Thus, by providing first cut 321 and second cut 322 on the trim mask together with the corresponding removal of the phase shifter with cut 302 on the phase mask, both the right and left corners of the feature are defined on a single mask, thereby providing more uniform printed corners.

In accordance with another feature of the invention, a third cut 323 can also be made in trim mask layout 320, i.e. the thin rectangle. Third cut 323, when implemented in a trim mask, allows exposure of the resist associated with the line edge opposite the two corners. Thus, third cut 323 can define the edge of the line opposite the two corners. As discussed above, a corresponding modification of the phase shifting mask is desirable (see cut 303 in FIG. 3A).

Because the corners of the T-intersection as well as the portion of the line opposite such corners are defined only with a trim mask, CD control at the intersection can be better maintained, irrespective of any misalignment with its corresponding FPSM. To ensure that the FPSM facilitates this objective, certain modifications can be made in the FPSM. That is certain additional cuts can be made to the associated FPSM layout (i.e. FPSM layout 300 in FIG. 3A), wherein such additional cuts directly correspond to the cuts of the trim mask layout (i.e. trim mask layout 320 in FIG. 3B). For example, with respect to cut 322, a cut 302 can be made in a shifter 310. In a similar manner, with respect to cut 323, a cut 303 can be made in a shifter 309. Note that cuts 321 and 301/306 also have a direct correspondence. Of importance, the location and size of cuts 301, 302, and 303 depend on the location and size of cuts 321, 322, and 323, respectively.

In some embodiments, the finished layouts shown in FIGS. 3A–3B may be subject to additional resolution enhancement techniques, e.g. proximity corrections of various sorts, such as model- and/or rule-based proximity corrections.

Figure 1C:
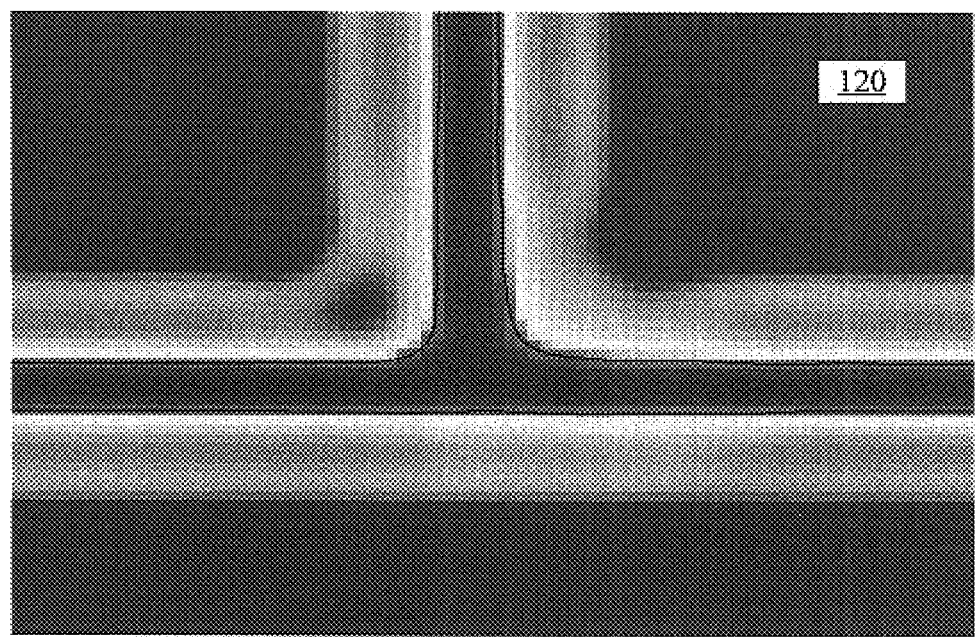
FIG. 1C illustrates an aerial image assuming a double exposure using masks implementing the FPSM layout of FIG. 1A and the trim mask layout of FIG. 1B.
Figure 2A:
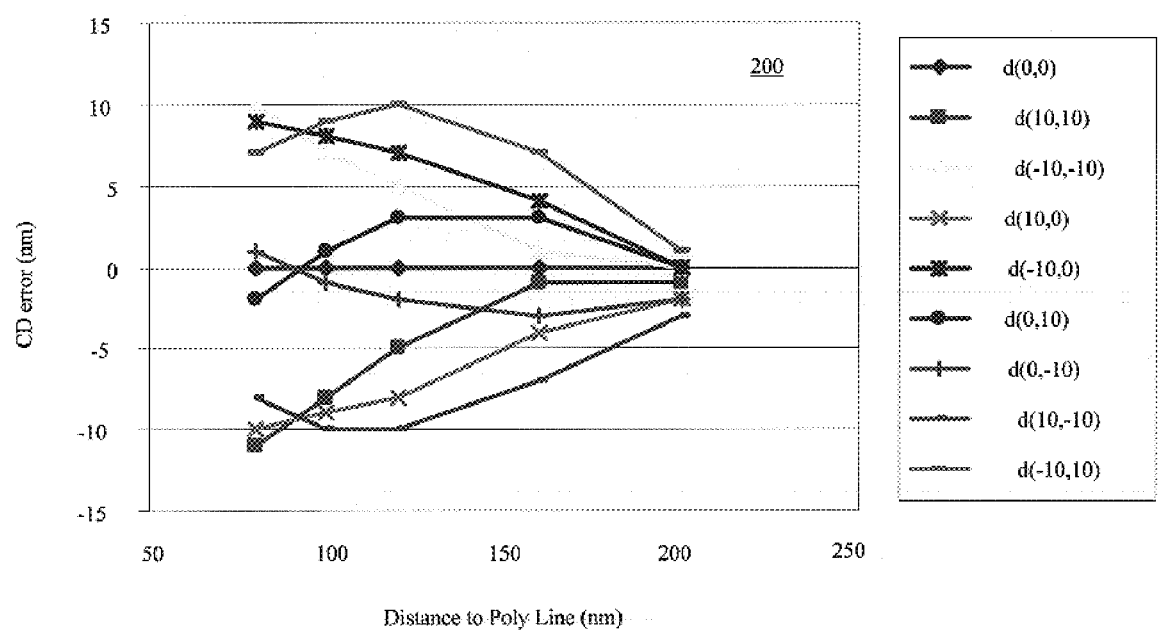
FIG. 2A illustrates a graph that plots the CD error versus the distance to a polysilicon line for various misalignments of the FPSM mask of FIG. 1A and the trim mask of FIG. 1B.
Figure 2B:
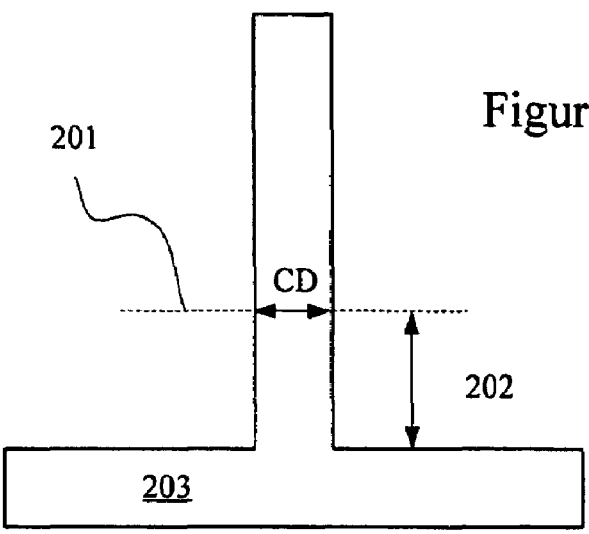
FIG. 2B illustrates a desired T-intersection layout, wherein a CD is measured at a cut line taken at a distance from a polysilicon line.
Figure 3C:
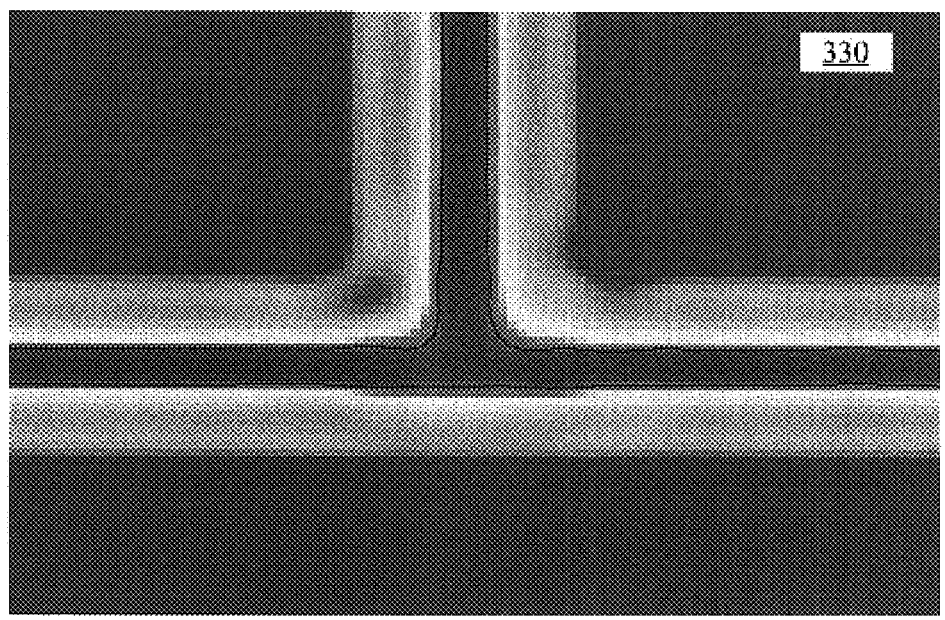
FIG. 3C illustrates an aerial image generated using masks implementing the FPSM layout of FIG. 3A and the trim mask layout of FIG. 3B. The modified mask set provides CDs that are significantly closer to the nominal CD than those shown in FIG. 1B.

Thus, as shown in FIGS. 3A and 3B, a shifter configuration in the FPSM layout can necessitate a corresponding cut in the trim mask layout. This cut can define a corner or edge of the feature. To improve CD control of this feature, additional cuts in the trim mask layout can define other corners and/or edge portions of the same feature. In this manner, CD variations resulting from any misalignment between the FPSM mask and the trim mask can be better controlled. For example, as shown in FIG. 3C, an aerial image 330 generated using masks implementing FPSM layout 300 and trim mask layout 320 provides CDs that are significantly closer to the nominal CD than those shown in FIG. 1C. In this example, the wavelength is 193 nm, the numerical aperture (NA) is 0.7, the partial coherence factor ($\sigma$) is 0.5, and the exposure ratio is 1:2 (e.g. identical to those used to produce the aerial image in FIG. 1C and the graphs in FIG. 2A).

Figure 2C:
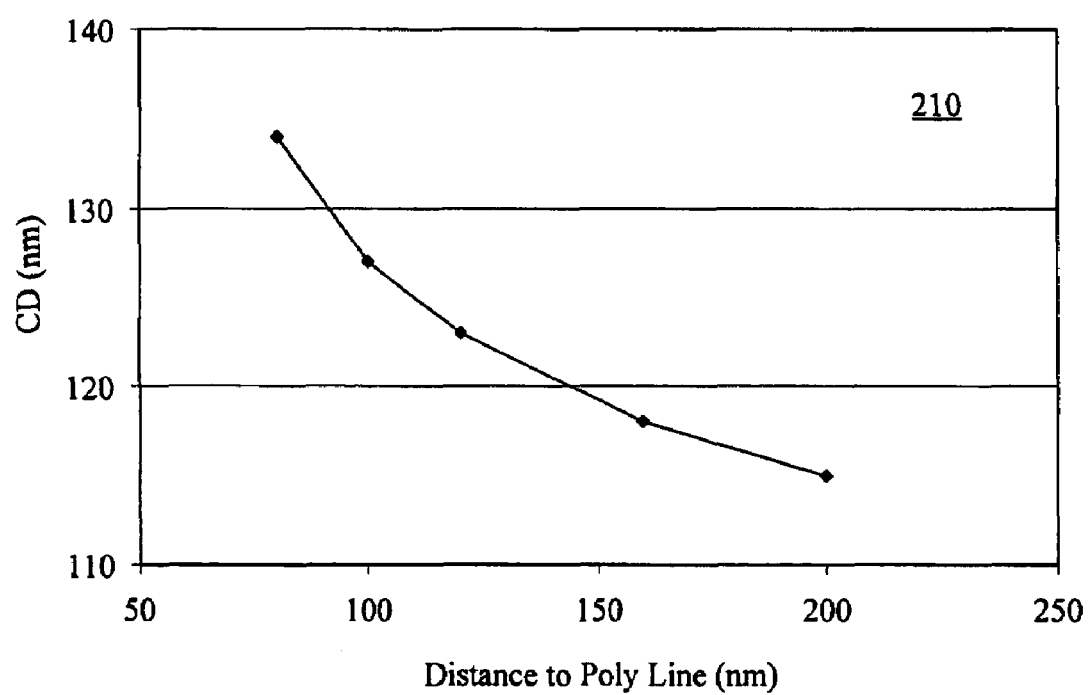
FIG. 2C illustrates a graph that plots the CD versus the distance to the polysilicon line.
Figure 4A:
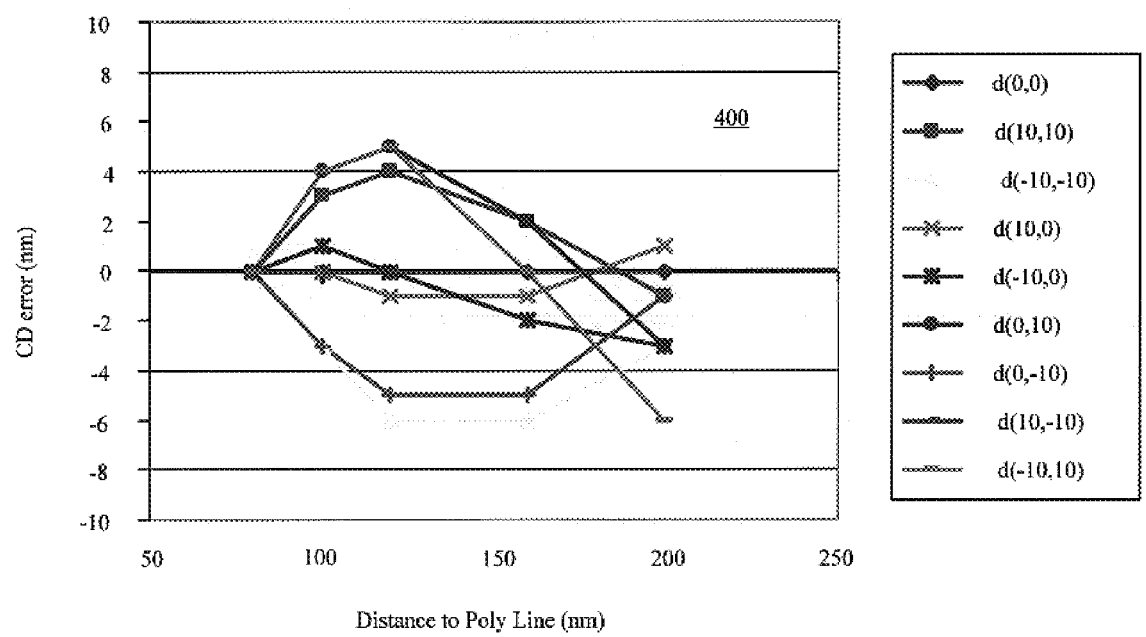
FIG. 4A illustrates a graph that plots the CD error versus the distance to a polysilicon line for various misalignments of a modified mask set.
Figure 4B:
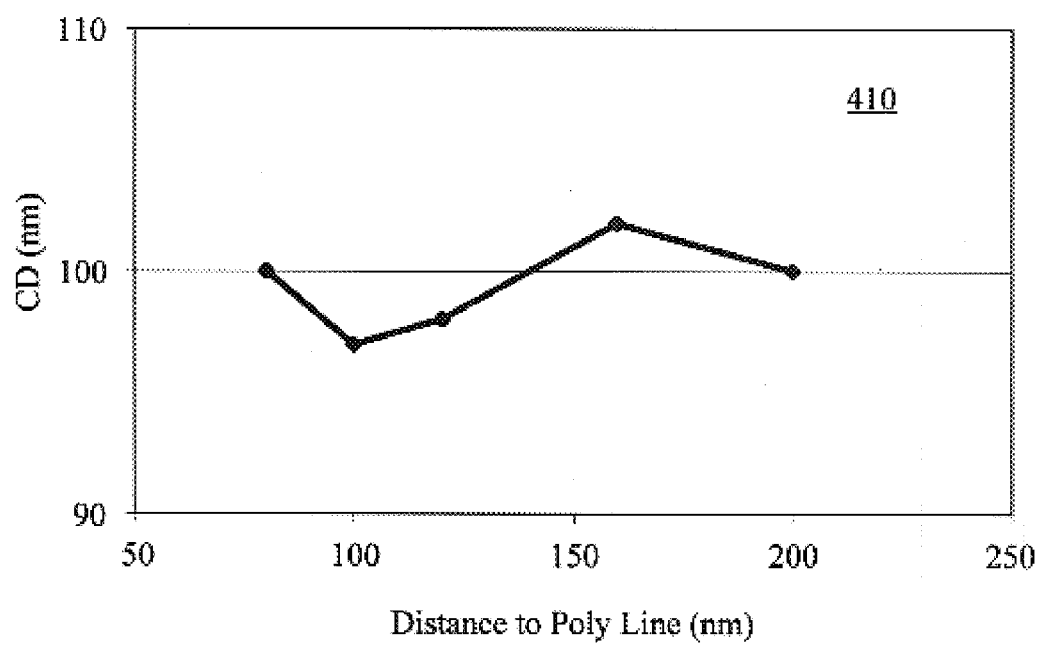
FIG. 4B illustrates a graph that plots the CD versus the distance to the polysilicon line. In this example, with minor variations, the average CD is approximately the nominal CD.

FIG. 4A illustrates a graph 400 that plots the CD error versus the distance to a polysilicon line for various misalignments of a FPSM mask and a trim mask, both masks including feature-defining cuts (e.g. masks implementing FPSM layout 300 and trim mask layout 320). The indicated measurements in FIG. 4A, i.e. the CD errors, distances, and misalignments are in nanometers. The misalignments shown in the legend (to the immediate right of FIG. 4A), d(0,0), d(10,10), etc., refer to (x,y) misalignments of the FPSM and the trim mask relative to each other. Of importance, the CD errors using the modified mask set are significantly less than those shown in FIG. 2A. Specifically, in this example, the maximum CD error is advantageously reduced from 10 nm (FIG. 2A) to 6 nm (FIG. 4A). FIG. 4B illustrates a graph 410 that plots the CD versus the distance to the poly line (both measurements in nanometers). In this example, with minor variations, the average CD is approximately the nominal CD. FIG. 4B is best contrasted with FIG. 2C to see how embodiments of the invention improve CD control even as the target CD is varied.

Figure 5A:
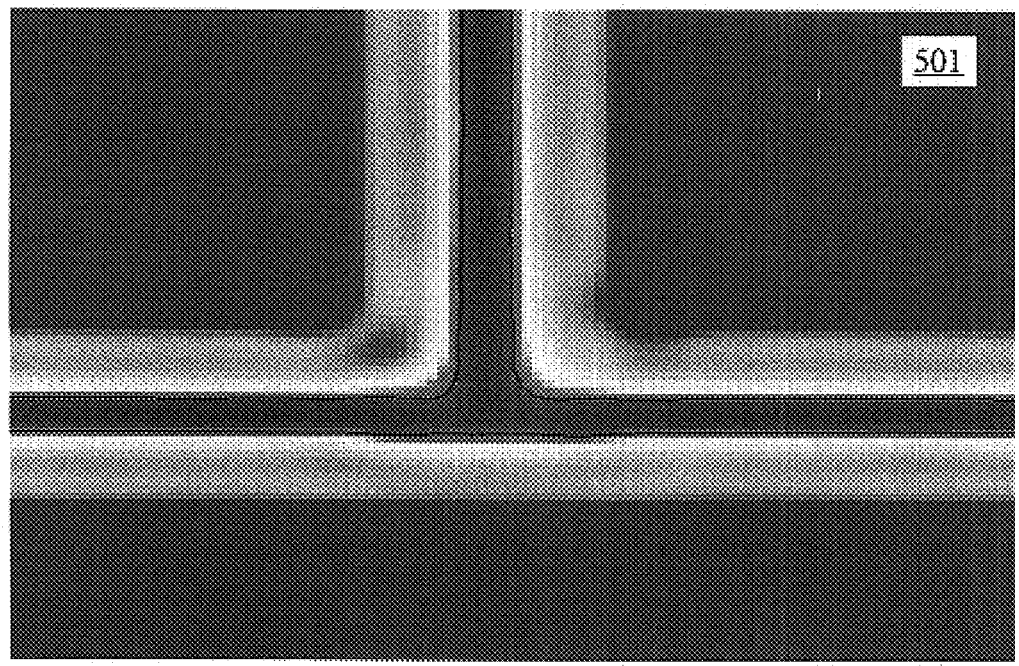
FIGS. 5A, 5B, and 5C illustrate printed features using a modified mask set with various mask misalignments.
Figure 5B:
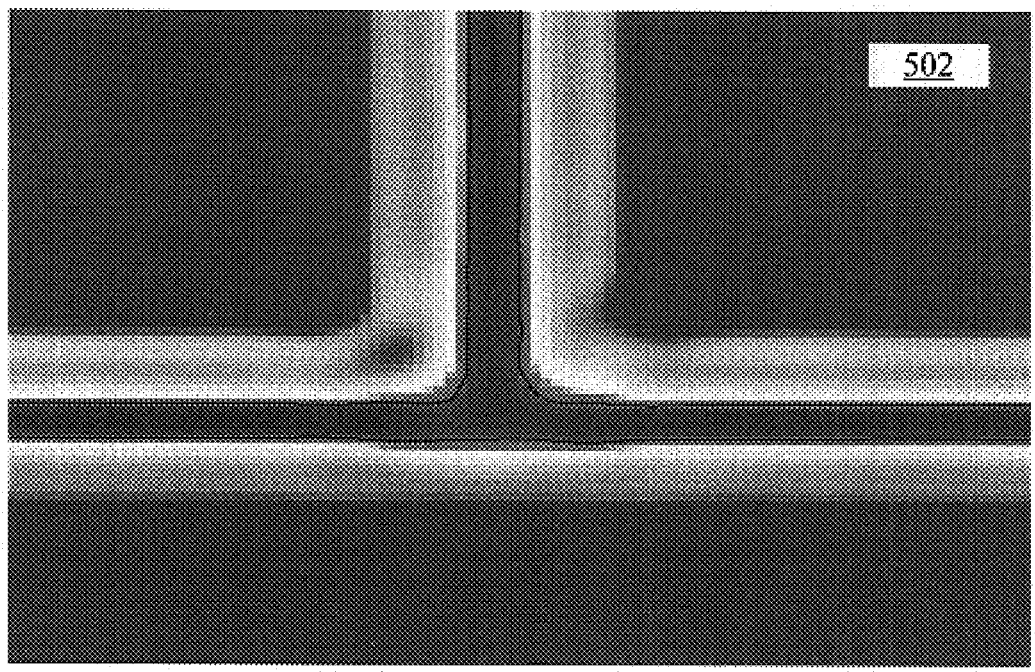
Figure 5C:
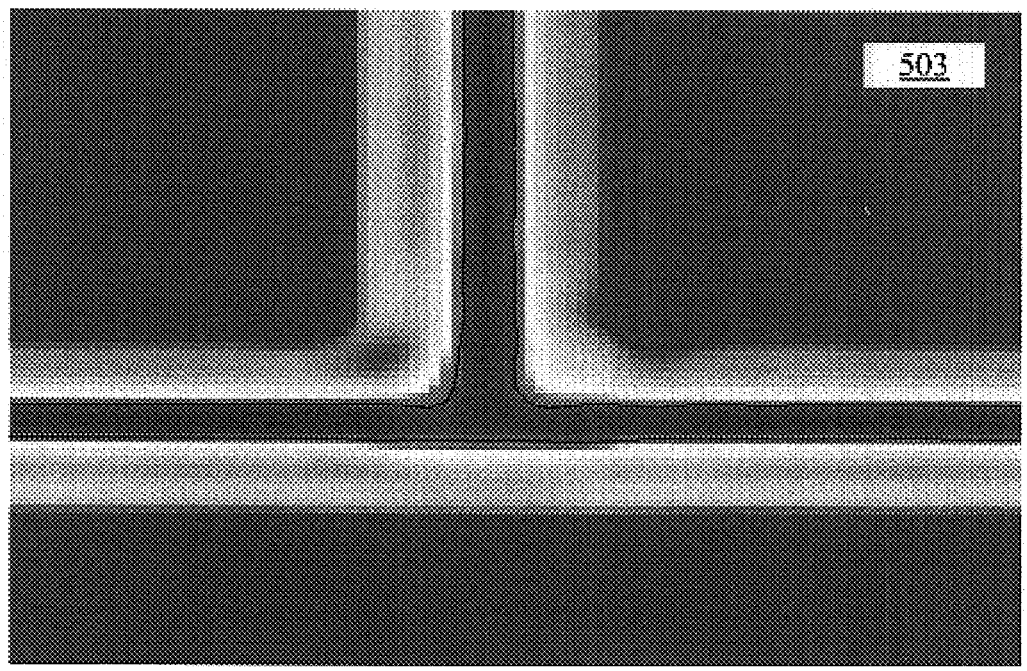

FIGS. 5A, 5B, and 5C illustrate printed features 501, 502, and 503, respectively, using masks implementing FPSM layout 300 and trim mask layout 320 with some of the mask misalignments referenced in FIG. 4A. Specifically, FIG. 5A simulates a mask misalignment of (0,0), FIG. 5B simulates a mask misalignment of (0,−10), and FIG. 5C simulates a mask misalignment of (10,0). Printed features 501, 502, and 503, irrespective of their varying mask misalignments, advantageously exhibit substantially the same CDs at the corners of the T-intersection.

Figure 5D:
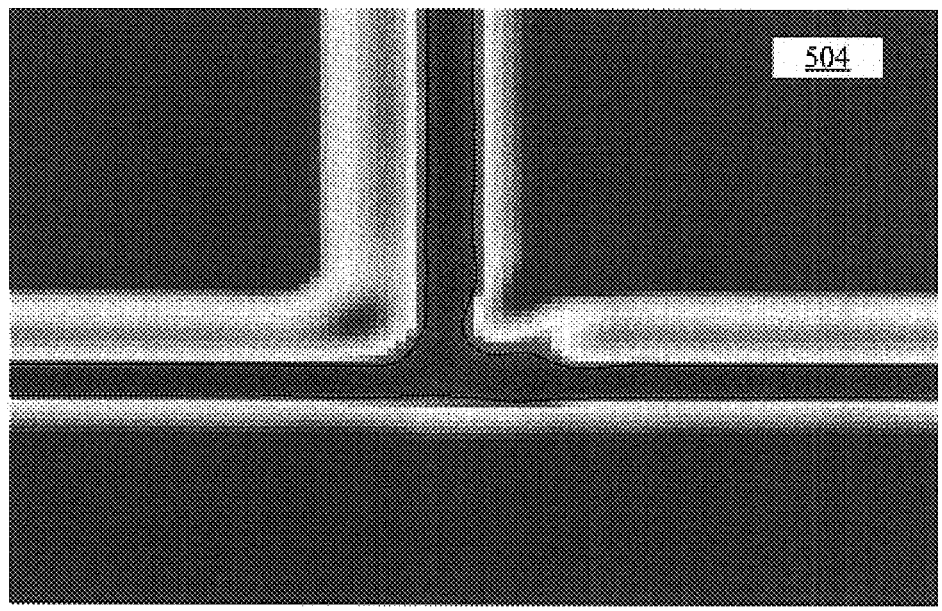
FIG. 5D illustrates a printed feature using a modified mask set with extreme mask misalignment. Advantageously, even with such extreme mask misalignment, the CDs of the feature remain within an acceptable range.

FIG. 5D illustrates a printed feature 504 using masks implementing FPSM layout 300 and trim mask layout 320 with an extreme mask misalignment of (30,−30). Advantageously, even with such extreme mask misalignment, the CDs of the corners remain within an acceptable range. In contrast, printing a feature using masks implementing FPSM layout 100 and trim mask layout 110 could result in CDs significantly outside this acceptable range. Thus, the modified mask set (i.e. the mask set with the feature-defining cuts) provides CDs significantly closer to a nominal (i.e. desired) CD.

Figure 6A:
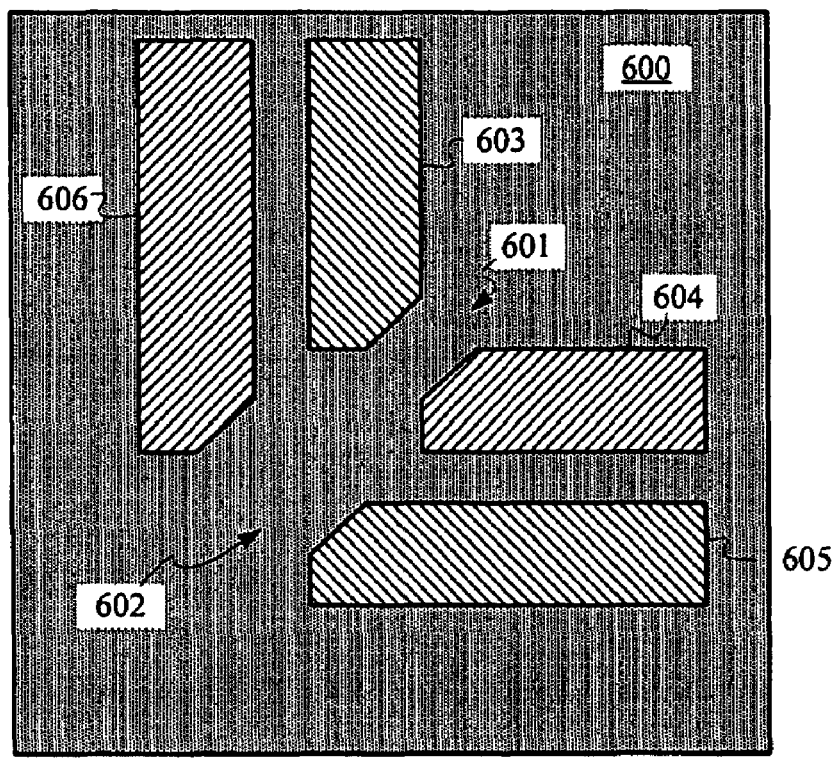
FIG. 6A illustrates a modified FPSM layout for defining an elbow.
Figure 6B:
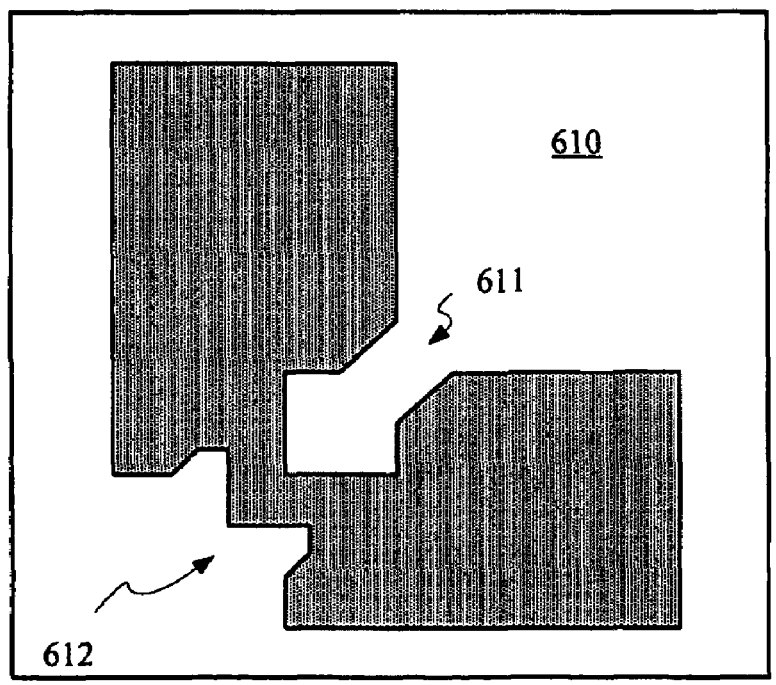
FIG. 6B illustrates a modified trim mask layout that in combination with the modified FPSM layout of FIG. 6A can define the elbow feature.

The use of additional cuts in both the FPSM and trim mask can be applied to any non-critical feature (e.g. intersecting lines, such as T-intersections, elbows, etc.). For example, FIG. 6A illustrates a FPSM layout 600 for defining an elbow. In this example, shifters 603 and 604, with a cut 601 between those shifters, can be provided to resolve a potential phase conflict with another feature (not shown for simplicity). To ensure optimal printing, shifters 605 and 606, with a cut 602 between those shifters, can be provided on the opposite side of the feature. FIG. 6B illustrates a trim mask layout 610 that in combination with FPSM layout 600 can define the elbow feature. In accordance with one aspect of the invention, trim mask layout 610 includes a cut 611 that defines an inside edge of the elbow feature as well as a cut 612 that defines an outside edge of the elbow feature. Thus, as shown by FIGS. 6A and 6B, FPSM layout 600 can be used to define critical features, whereas trim mask layout 610 can be used to define non-critical features (in this case, an elbow feature).

Figure 6C:
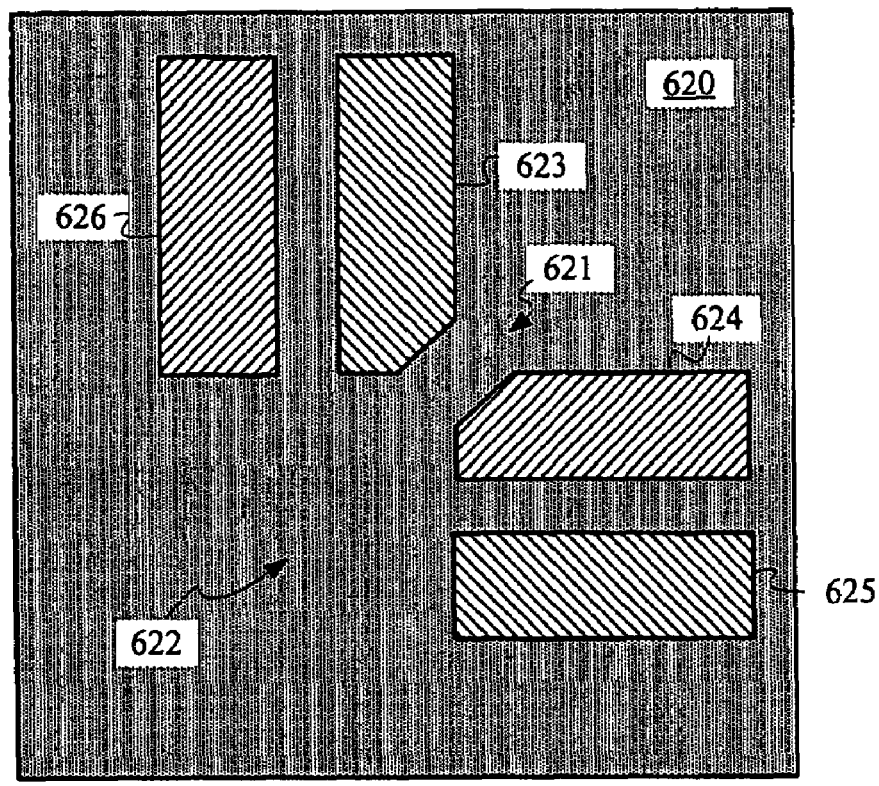
FIG. 6C illustrates another modified FPSM layout for defining an elbow.
Figure 6D:
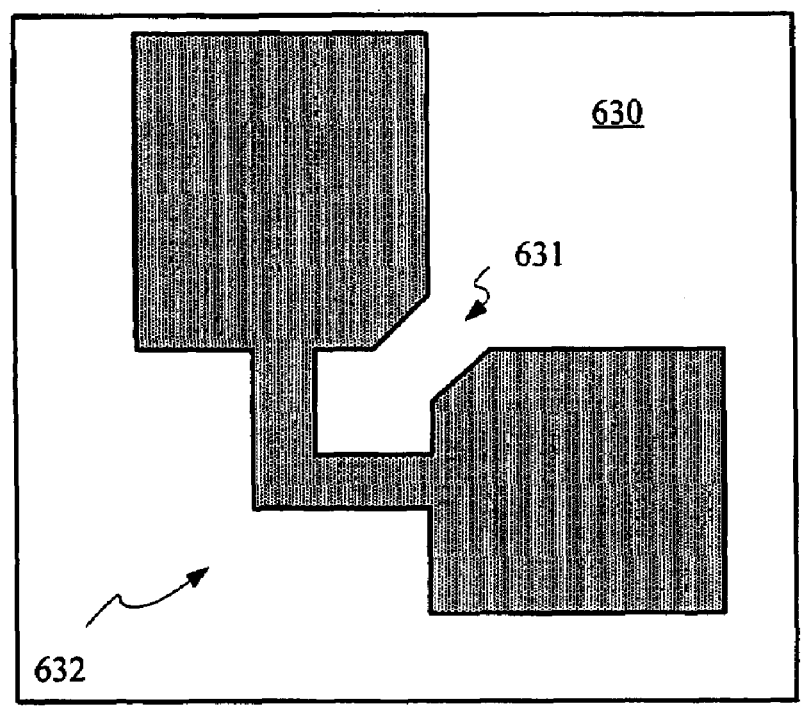
FIG. 6D illustrates a modified trim mask layout that in combination with the modified FPSM layout of FIG. 6C can define the elbow feature.

FIG. 6C illustrates another FPSM layout 620 for defining an elbow. In this example, shifters 623 and 624, with a cut 621 between those shifters, can be provided to resolve a potential phase conflict with another feature (not shown for simplicity). To ensure optimal printing, shifters 625 and 626, with a cut 622 between those shifters, can be provided on the opposite side of the feature. Note that the size of shifters 625 and 626 can be reduced compared to shifters 604 and 606. Specifically, phase shifting to define an outer edge of an elbow generally does not assist in providing more CD control. Therefore, in this embodiment, shifters 625 and 626 are placed in areas where CD control is achievable with such phase shifting. FIG. 6D illustrates a trim mask layout 630 that in accordance with one aspect of the invention includes cut 631 that defines an inside corner of the elbow feature and a cut 632 that defines an outside corner of the elbow feature. As with FPSM layout 600 and trim mask layout 610 (FIGS. 6A and 6B), FPSM layout 620 can be used to define critical features, whereas trim mask layout 630 can be used to define non-critical features (in this case, an elbow feature). Note that the mask set formed using the layouts shown in FIGS. 6C and 6D could be easier to design and/or fabricate than the mask set formed using the layouts shown in FIGS. 6A and 6B while providing substantially equivalent performance.

Figures 8A, 8B:
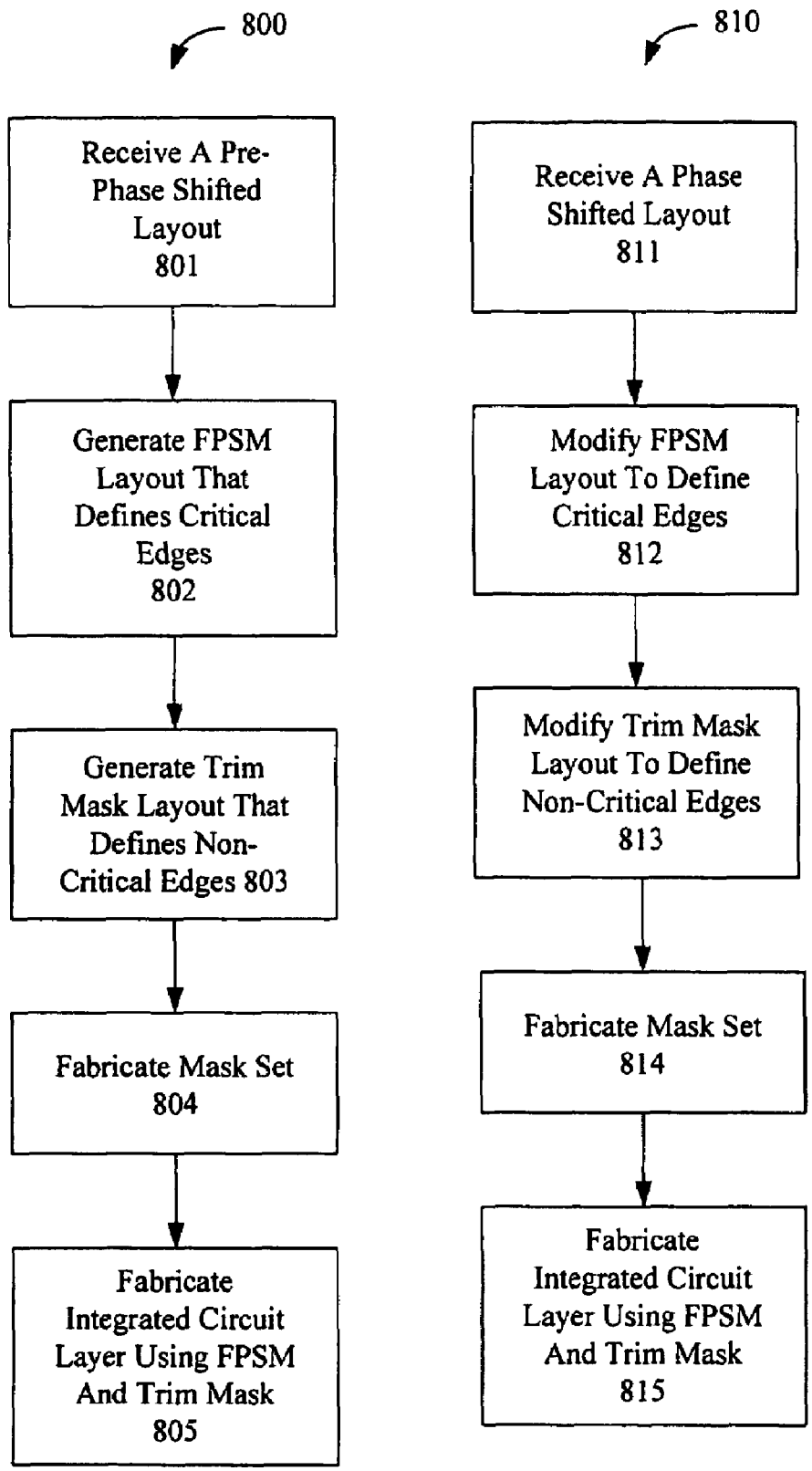
FIG. 8A illustrates a process for improved critical dimension (CD) control for features in a layer of material on a wafer.
FIG. 8B illustrates another process for improved critical dimension (CD) control for features in a layer of material on a wafer.

FIG. 8A illustrates a process 800 for improving critical dimension (CD) control for features in a layer of material on a wafer. Process 800 includes receiving a pre-phase shifted (e.g. the original) layout in step 801. In step 802, a FPSM layout can be generated that defines the critical edges of features in the original layout. The FPSM layout can include a first set of cuts between adjacent phase shifters to resolve phase conflicts for defining the features. The FPSM layout can further include a second set of cuts proximate the first set of cuts. The second set of cuts permit definition of edge portions proximate the first set of cuts using a corresponding trim mask layout. In step 803, the trim mask layout can be generated that defines the non-critical edge portions of features in the original layout. The non-critical edge portions can include edge portions corresponding to the second set of cuts. In step 804, a mask set can be fabricated. That is, a FPSM can be fabricated using the FPSM layout (generated in step 802) and a trim mask can be fabricated using the trim mask layout (generated in step 803). In step 805, the IC layer can be fabricated on a wafer using the FPSM and the trim mask.

FIG. 8B illustrates an alternative process 810 for improving critical dimension (CD) control for features in a layer of material on a wafer. This process includes receiving a phase shifted layout in step 811. In one embodiment, the phase shifted layout can include a full phase shift mask (FPSM) layout and a corresponding trim mask layout. In step 812, the FPSM layout can be modified to define the critical edge portions of the features. To provide this definition, the FPSM layout can include a first set of cuts between adjacent phase shifters to resolve phase conflicts in defining the features. Of importance, the FPSM layout can further include a second set of cuts proximate the first set of cuts. The second set of cuts permit definition of edge portions proximate the first set of cuts using a corresponding trim mask layout. In step 813, the trim mask layout can be modified to define the non-critical edge portions of the features. The non-critical edge portions can include edge portions corresponding to the second set of cuts. In step 814, a mask set can be fabricated. That is, a FPSM can be fabricated using the modified FPSM layout (generated in step 812) and a trim mask can be fabricated using the modified trim mask layout (generated in step 813). In step 815, the IC layer can be fabricated on a wafer using the FPSM and the trim mask.

Note that in processes 800 and 810, defining the non-critical edge portions can include providing a first cut on the trim mask layout, wherein the first cut defines a first corner of at least two intersecting lines. Defining the non-critical edge portions can further include providing a second cut on the trim mask layout, wherein the second cut defines either a second corner of the intersecting lines or a portion of a line edge opposite from the first and second corners. In one embodiment, the first and second cuts are made only if a phase conflict would otherwise occur in an area in the FPSM layout corresponding to the first and second cuts.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

Figure 7:
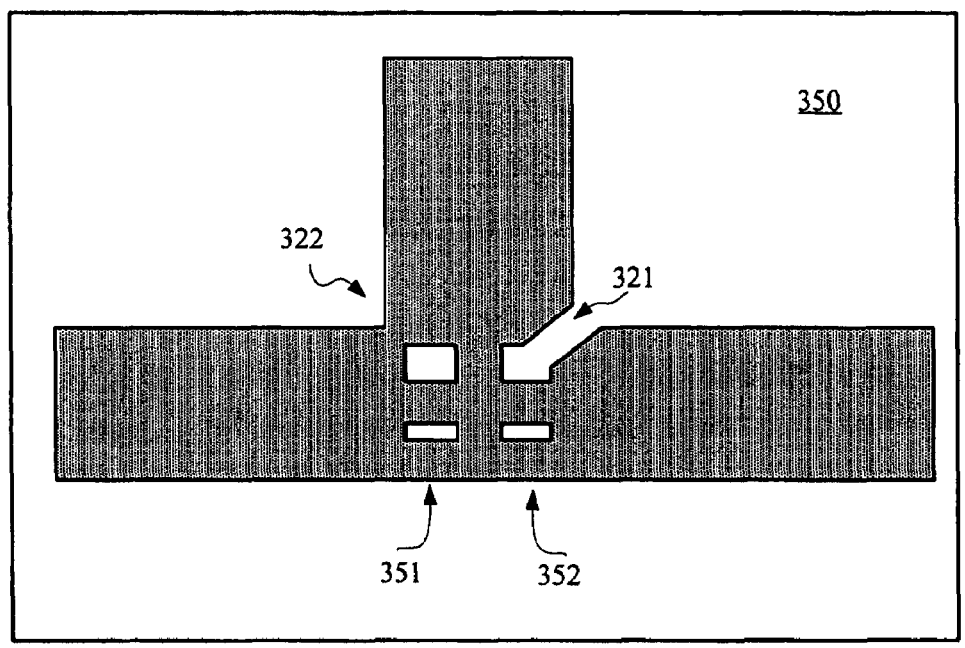
FIG. 7 illustrates a modified trim mask layout that defines a majority of the non-critical edge portions of exemplary intersecting lines.

For example, FIG. 7 illustrates a modified trim mask layout 350 that is similar to modified trim mask layout 320. However, instead of cut 323 defining the portion of the line edge opposite that of the two corners in the T-intersection, two cuts 351 and 352 can be provided. In this embodiment, cuts 351 and 352, which respectively correspond to cuts 322 and 321, provide a minimal approach to reducing the effects of mask set misalignment. In this case, the remaining portion of the line edge between cuts 351 and 352 could be defined by the corresponding FPSM layout (not shown although it would be similar to FIG. 3A with two cuts instead of one where cut 303 is located on shifter 309). In one embodiment, a limited number of critical features could be defined by the trim mask layout. Thus, a modified mask set in accordance with one embodiment, can include a FPSM mask that defines a majority of the critical features and a trim mask that defines a majority of the non-critical features.

Note that the terms "critical" and "non-critical" can be user-defined for a specific layout. Thus, in one embodiment, T-intersections could be designated non-critical features whereas elbows could be designated critical features. Thus, having a trim mask define a majority of the non-critical features could refer to portions of the features or different features in the layout.

The techniques described herein can be applied to mask layouts for various lithographic process technologies, including ultraviolet, deep ultraviolet (DUV), extreme ultraviolet (EUV), x-ray, etc. Accordingly, it is intended that the scope of the invention be defined by the following Claims and their equivalents.

The invention claimed is:

1. A method for improving critical dimension (CD) control for features in a layer of material on a wafer, the method comprising:
defining critical edge portions of the features with a full phase shifting mask (FPSM), the FPSM including a first set of cuts between adjacent phase shifters to resolve phase conflicts for defining the features using the FPSM and a second set of cuts proximate the first set of cuts for permitting definition of edge portions proximate the first set of cuts using a trim mask; and
defining non-critical edge portions corresponding to the second set of cuts with the trim mask.

2. The method of claim 1, wherein defining non-critical edge portions of the features includes providing a first cut on the trim mask, the first cut defining a first corner of at least two intersecting lines.

3. The method of claim 2, wherein defining non-critical edges of the features includes providing a second cut on the trim mask, the second cut defining one of a second corner of the intersecting lines and a portion of a line edge opposite from the first and second corners.

4. The method of claim 3, wherein the first and second cuts are made only if a phase conflict would otherwise occur in an area in the FPSM corresponding to the first and second cuts.

5. A method of improving critical dimension (CD) control at intersecting lines on a wafer, the wafer being formed by exposing a full phase PSM (FPSM) and a trim mask, the FPSM being formed using a FPSM layout and the trim mask being formed using a trim mask layout, the method including:
providing a first cut on the trim mask layout, the first cut defining a first corner of the intersecting lines;
providing a second cut on the trim mask layout, the second cut defining a second corner of the intersecting lines; and
providing shifter cuts in the FPSM layout, the shifter cuts corresponding to the first and second cuts.

6. The method of claim 5, wherein the intersecting lines form a T-intersection.

7. The method of claim 6, further including providing a third cut on the trim mask layout, the third cut defining an edge opposite the first and second corners.

8. The method of claim 5, wherein the intersecting lines form an elbow.

9. The method of claim 8, wherein a shifter cut corresponding to an outside corner of the elbow and a shifter cut corresponding to an inside corner of the elbow have aligned edges.

10. A method of making line intersections on a layout for a layer of material on a wafer less sensitive to misalignment, the method including:
defining critical edge portions in the layout with a full phase PSM (FPSM), the FPSM including a first set of cuts between adjacent phase shifters to resolve phase conflicts in defining the layout using the FPSM and a second set of cuts proximate the first set of cuts for permitting definition of edge portions proximate the first set of cuts using a trim mask; and
defining non-critical edge portions corresponding to the second set of cuts with the trim mask.

11. The method of claim 10, wherein non-critical edge portions include at least one of T-intersections and elbows.

12. The method of claim 11, wherein the trim mask is a dark field trim mask.

13. The method of claim 11, wherein the FPSM is fabricated using a FPSM layout and the trim mask is fabricated using a trim mask layout, and wherein defining non-critical edge portions includes:
providing a first cut on the trim mask layout, the first cut defining a first corner of at least two intersecting lines; and
providing a second cut on the trim mask layout, the second cut defining one of a second corner of the at least two intersecting lines and an edge portion of the at least two intersecting lines, the edge portion being opposite the first and second corners.

14. The method of claim 13, wherein providing the first and second cuts is performed only if a phase conflict would otherwise occur in an area in the FPSM layout corresponding to the first and second cuts.

15. A lithographic mask set used to transfer a pattern onto a wafer, the pattern including critical and non-critical features, the lithographic mask set comprising:
a full phase PSM (FPSM) for defining a majority of the critical features of the pattern, the FPSM including a first set of cuts between adjacent phase shifters to resolve phase conflicts in defining a layout using the FPSM and a second set of cuts proximate the first set of cuts; and
a trim mask for defining a majority of the non-critical features of the pattern, the non-critical features including non-critical edge portions corresponding to the second set of cuts.

16. The lithographic mask set of claim 15, wherein the non-critical features include at least one of T-intersections and elbows.

17. Computer software for performing layout processing using a computer system on at least a portion of an integrated circuit (IC) layout, the IC layout comprising a plurality of features, the computer software comprising:
code for defining critical edge portions of the features with a full phase shifting mask (FPSM), the FPSM including a first set of cuts between adjacent phase shifters to resolve phase conflicts for defining the features using the FPSM and a second set of cuts proximate the first set of cuts for permitting definition of edge portions proximate the first set of cuts using a trim mask; and
code for defining non-critical edge portions corresponding to the second set of cuts with the trim mask.

* * * * *